(12) United States Patent
Haslebner et al.

(10) Patent No.: US 10,321,558 B2
(45) Date of Patent: Jun. 11, 2019

(54) PRINTED CIRCUIT BOARD

(71) Applicant: AT & S Austria Technologie & Systemtechnik Aktiengesellschaft, Leoben-Hinterberg (AT)

(72) Inventors: Nikolai Haslebner, Graz (AT); Markus Leitgeb, Trofalach (AT); Michael Goessler, Kobenz (AT); Mike Morianz, Graz (AT)

(73) Assignee: AT & S AUSTRIA TECHNOLOGIE & SYSTEMTECHNIK AKTIENGESELLSCHAFT, Hinterberg Leoben (AT)

( * ) Notice: Subject to any disclaimer, the term of this patent is extended or adjusted under 35 U.S.C. 154(b) by 200 days.

(21) Appl. No.: 14/971,688

(22) Filed: Dec. 16, 2015

(65) Prior Publication Data

US 2016/0105953 A1    Apr. 14, 2016

Related U.S. Application Data

(63) Continuation of application No. 13/822,648, filed as application No. PCT/AT2011/000374 on Sep. 14, 2011, now Pat. No. 9,226,390.

(30) Foreign Application Priority Data

Sep. 17, 2010  (AT) .................................. 585/2010 U

(51) Int. Cl.
*H05K 1/02*    (2006.01)
*H05K 3/46*    (2006.01)
(Continued)

(52) U.S. Cl.
CPC ........... *H05K 1/0266* (2013.01); *H05K 1/028* (2013.01); *H05K 1/0298* (2013.01); *H05K 1/11* (2013.01);
(Continued)

(58) Field of Classification Search
CPC ........... H05K 1/118; H05K 1/188–189; H05K 1/0393
(Continued)

(56) References Cited

U.S. PATENT DOCUMENTS 4,423,127 A    12/1983   Fujimura
4,626,462 A    12/1986   Kober et al.
(Continued)

FOREIGN PATENT DOCUMENTS

JP    61-136710     6/1986
JP    2008-509549 A  3/2008
WO    2006/011508 A1 2/2006

OTHER PUBLICATIONS

Chinese Office Action dated Jan. 5, 2015 issued to a corresponding Chinese patent application.
(Continued)

*Primary Examiner* — Tuan T Dinh
(74) *Attorney, Agent, or Firm* — Jacobson Holman, PLLC.

(57) ABSTRACT

A circuit board includes a plurality of circuit board areas, wherein the individual circuit board areas include at least one layer made of an in insulating base material and a conducting pattern located on or in, the base material, the following is provided: a substrate material, at least one registration mark formed in the substrate material, a first circuit board area arranged on the substrate material, at least one additional circuit board area, which substantially adjoins the first circuit board area or at least partially overlaps the first circuit board, the additional circuit board areas being oriented relative to the registration mark, and a plurality of connections of the conducting patterns of the first circuit board area and of the at least one additional circuit board
(Continued)

area. Thus improved registration and orientation can be achieved when circuit board areas are coupled.

5 Claims, 2 Drawing Sheets

(51) Int. Cl.
*H05K 3/36* (2006.01)
*H05K 1/11* (2006.01)
*H05K 1/14* (2006.01)
*H05K 1/18* (2006.01)

(52) U.S. Cl.
CPC ............... *H05K 1/115* (2013.01); *H05K 1/14* (2013.01); *H05K 1/18* (2013.01); *H05K 1/182* (2013.01); *H05K 1/189* (2013.01); *H05K 3/36* (2013.01); *H05K 3/4688* (2013.01); *H01L 2224/2518* (2013.01); *H05K 1/0269* (2013.01); *H05K 3/4638* (2013.01); *H05K 2201/0355* (2013.01); *H05K 2201/058* (2013.01); *H05K 2201/09918* (2013.01); *H05K 2201/09936* (2013.01); *H05K 2203/166* (2013.01); *Y10T 29/49126* (2015.01)

(58) Field of Classification Search
USPC .......... 361/748–749, 760–764; 29/825–834; 174/252–258
See application file for complete search history.

(56) References Cited

U.S. PATENT DOCUMENTS

| 6,237,218 | B1 | 5/2001 | Ogawa et al. |
| 6,535,398 | B1* | 3/2003 | Moresco ................. H01L 23/50 257/700 |
| 6,700,070 | B1* | 3/2004 | Hellriegel ............ H05K 1/0266 174/250 |
| 7,551,141 | B1* | 6/2009 | Hadley ............ G06K 19/07718 343/700 MS |
| 2009/0188703 | A1* | 7/2009 | Ito ..................... H01L 23/49838 174/255 |
| 2009/0199399 | A1 | 8/2009 | Kariya et al. |
| 2010/0025086 | A1 | 2/2010 | Stahr et al. |

OTHER PUBLICATIONS

Japanese Office Action dated Apr. 28, 2015 issued to a corresponding Japanese patent application.

* cited by examiner

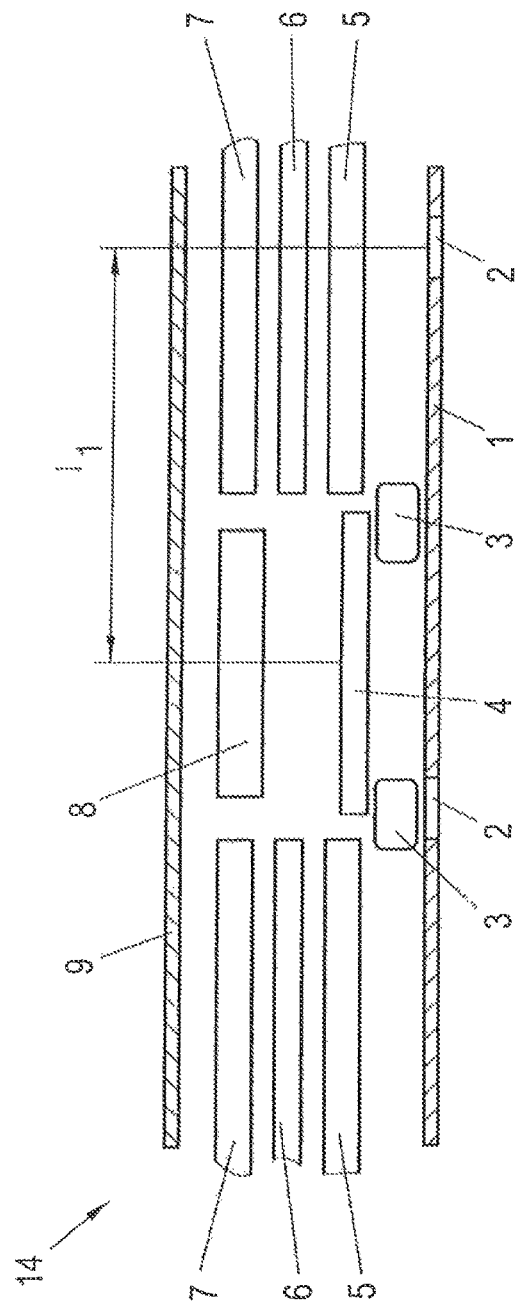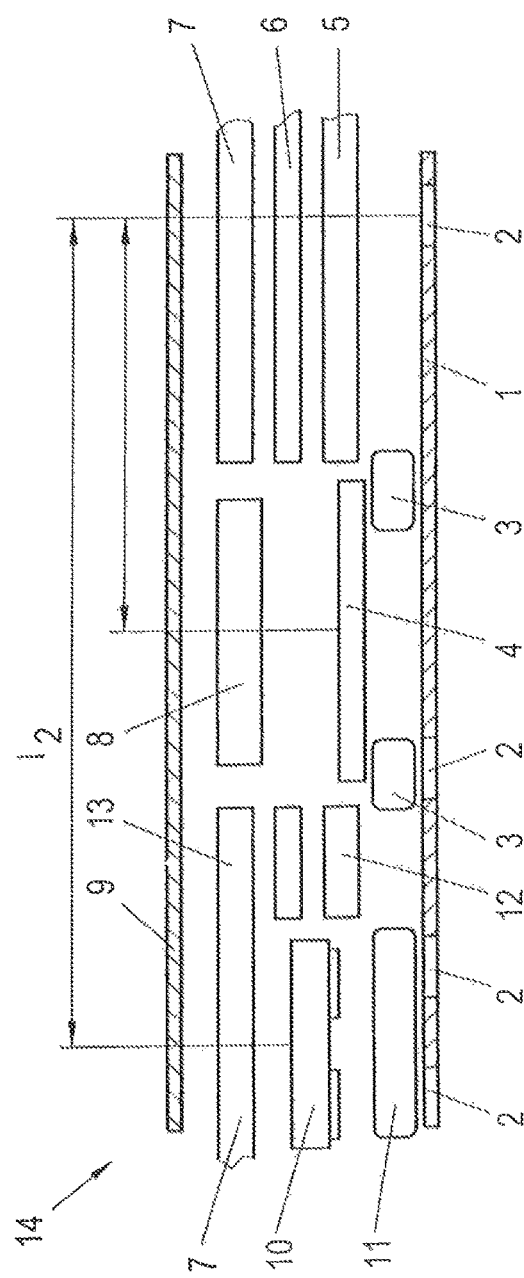

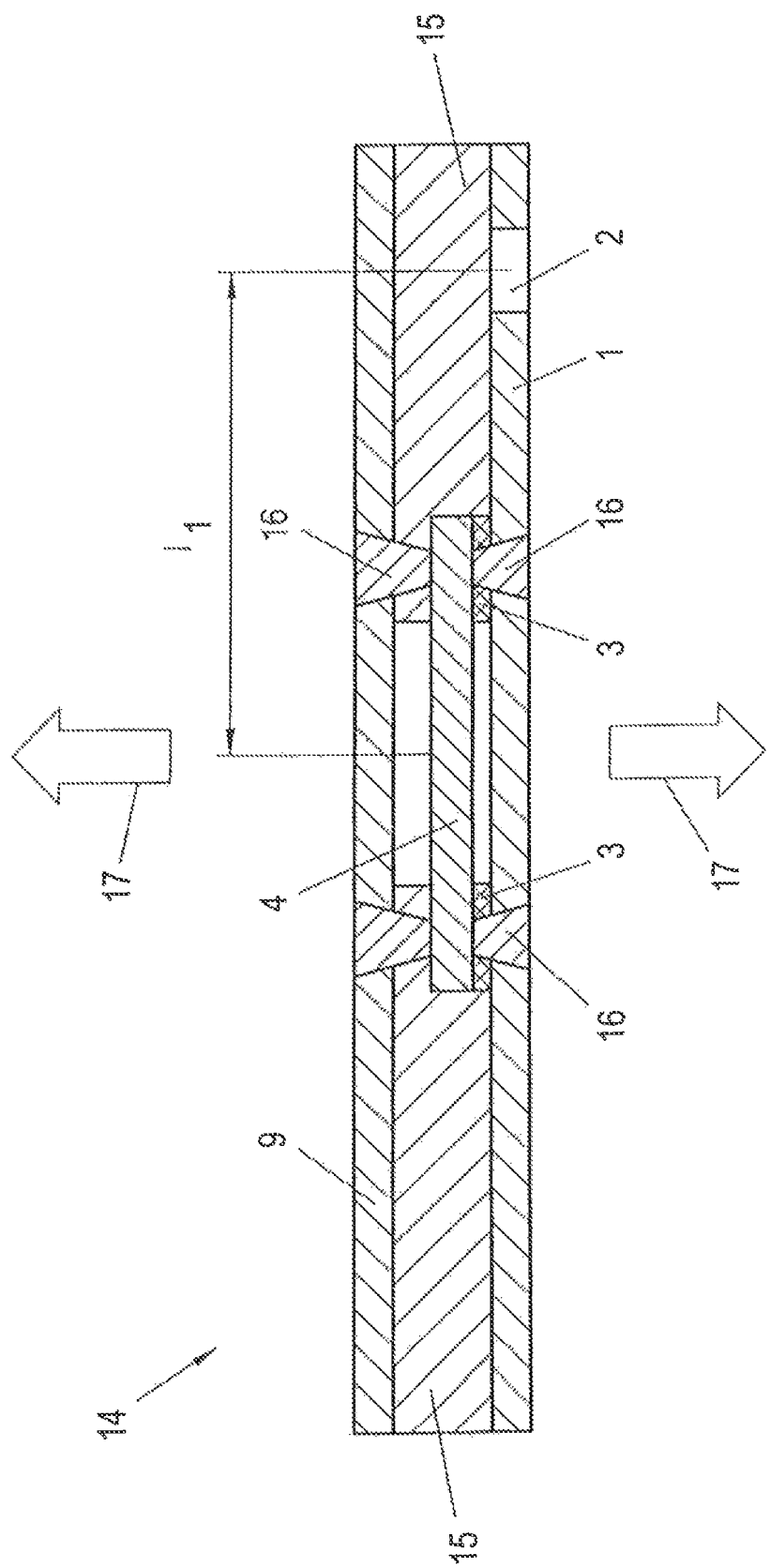

PRINTED CIRCUIT BOARD

This application is a Divisional Application of U.S. patent application Ser. No. 13/822,648 filed Mar. 13, 2013, which is a national stage of PCT/AT2011/000374 filed Sep. 14, 2011 and published in German, which has a priority of Austria no. GM 585/2010 filed Sep. 17, 2010, hereby incorporated by reference.

FIELD OF THE INVENTION

The present invention relates to a method for producing a circuit board consisting of a plurality of circuit board areas, wherein the individual circuit board areas comprise at least one layer made of an in particular insulating base material and a conducting or conductive pattern located on or in the base material, said method comprising the steps of:
  providing a substrate material,
  forming at least one registration mark in the substrate material,
  arranging a first circuit board area on the substrate material while orienting the first circuit board area relative to the registration mark.

The present invention, moreover, relates to a circuit board consisting of a plurality of circuit board areas, wherein the individual circuit board areas comprise at least one layer made of an in particular insulating base material and a conducting or conductive pattern located on or in the base material, comprising:
  a substrate material,
  at least one registration mark formed in the substrate material,
  a first circuit board area arranged on the substrate material, said first circuit board area being oriented relative to the registration mark.

PRIOR ART

In the context of the production of printed circuit boards consisting of several printed circuit board areas which are, in particular, separately produced and prepared such as, for instance, and, in particular, in the production of a rigid-flexible circuit board, it is proceeded according to presently known methods in a manner that a circuit board area is arranged on a substrate material, whereupon adjoining or contiguous circuit board areas are likewise arranged on the substrate material and usually contacted with each other. As a rule, additional layers or planes of such a circuit board are, moreover, connected to the mutually separated or separately produced circuit board areas in order to produce, as a whole, a multilayer circuit board. The presently known methods for producing such circuit boards consisting of several circuit boards or circuit board areas, in particular, involve the problem that the registration of individual circuit board areas to be connected to, or combined with, one another cannot be performed in a reasonable manner such that, according to the tolerances occurring in the production of individual circuit board areas, respective uncertainties in the relative positions or positioning of such individual circuit board areas that are connected to each other when producing a circuit hoard will exist or be caused. For the orientation of a circuit board area relative to a substrate layer according to the method and circuit board of the initially defined kind, it may, for instance, be referred to U.S. Pat. No. 4,626,462.

Such inaccuracies in the mutual arrangement of individual and, in particular, additional or further circuit board areas will immediately lead to problems when further processing, e.g. contacting and/or bonding, such individual circuit board areas, so that, for instance for ensuring appropriate contacting, correspondingly large or enlarged bonding sites or contacts will have to be provided, which will render difficult or impossible any desired miniaturization of such circuit hoards or circuit board areas.

SUMMARY OF THE INVENTION

The present invention, therefore, aims to avoid the above-identified problems and improve a method for producing a circuit board consisting of a plurality of circuit board areas, and a circuit board, of the initially defined kind to the effect that the mutual orientation or registration of individual and, in particular, additional circuit board areas to be coupled or connected to each other will be improved so as to subsequently enhance, in particular, the accuracy of arrangement when further processing such a circuit board consisting of a plurality of subareas. To solve the above-identified objects, a method of the initially defined kind substantially comprises the following additional steps:
  arranging at least one additional circuit board area substantially adjoining the first circuit board area, or at least partially overlapping the first circuit board area, on the substrate material while orienting the same relative to the registration mark, and
  connecting the conducting or conductive pattern of the first circuit board area to the conducting or conductive pattern of the at least one further circuit board area.

Since, in the substrate material, at least one registration mark is formed and the first circuit board area is arranged while orienting said circuit board area relative to the registration mark such that, according to the invention, even the adjoining circuit board areas, or circuit board areas at least partially overlapping said circuit board area, can likewise be positioned in respect to the precisely positioned, first circuit board area by being oriented relative to the registration mark, an enhancement of the accuracy of orientation of the individual and, in particular, additional circuit board areas relative to each other will be achieved. By providing such an enhanced orientation or positioning accuracy of individual circuit board areas to be connected to each other, it will subsequently be possible to perform further processing steps to be carried out, such as the formation of connection or contact sites or the like on the circuit board areas, likewise with an accordingly enhanced precision so as to make it altogether possible, particularly in view of the increasingly desired miniaturization of such elements, to do with smaller connecting elements while taking into account the elevated orientation or positioning accuracy. By providing at least one registration mark in the substrate material, and after having positioned the first circuit board area and also the further circuit board areas relative to said at least one registration mark, it is thus possible to produce a circuit board whose individual circuit board areas can be arranged, and subsequently coupled or connected to each other, with an elevated orientation or positioning accuracy.

For the proper and exact positioning of at least the first circuit board area, it is proposed according to a preferred embodiment that at least the first circuit board area is fixed to the substrate material via an interposed adhesive. The use of an adhesive enables the direct fixation of the first circuit board area to the substrate material in such a manner as to achieve an enhancement of the respective orientation or arrangement even of the further circuit board areas, which, in accordance with the first circuit board area oriented with reference to the registration mark, can thus likewise be positioned in a correspondingly precise or more precise manner. By using an adhesive for fixing the first circuit board area, it will, moreover, be possible to do with more cost-effective materials, for instance usually used prepregs with optionally large or elevated resin flows, since in further processing or treatment steps of the circuit board under optionally elevated pressure and/or temperature, an excessive flow of, in particular, the base materials of the further circuit hoard areas will be prevented by providing the adhesive for fixing the first circuit board area. The use of low-flow prepregs can, thus, for instance, be renounced, in particular for the further circuit board areas or their base materials, thus also achieve a more cost-effective manufacture in addition to the enhanced registration or orientation accuracy of the individual circuit board areas to be coupled to each other enabled by the invention.

In connection with the further construction of a circuit board according to the invention using the method of the invention, it is proposed according to a further preferred embodiment that at least one in particular electronic component is additionally arranged on the substrate material, and/or embedded in the at last one further circuit board area and contacted with at least one conducting or conductive pattern, wherein the component is oriented relative to the at least one registration mark. By providing the at least one registration mark, it has thus become possible to precisely position additional components likewise in accordance with, and relative to, the individual circuit board areas so as to provide the registration or positioning accuracy required for proper contacting even to such additional, in particular electronic, components usually comprising a plurality of contact sites having comparatively small dimensions.

In particular, in order to further simplify the interconnection provided by the invention, of the conducting or conductive patterns of the individual circuit board areas, it is proposed according to a further preferred embodiment that the substrate material is formed by a conducting film. By providing a conducting film as substrate material, it will be possible, after having fixed or arranged the individual circuit board areas on the substrate material, for instance by simply patterning the substrate material and providing appropriate contact sites, to immediately effect the coupling or connection of the conducting or conductive patterns of the individual, adjacently arranged circuit board areas.

As already pointed out several times, the method according to the invention enables the further mounting of additional layers or plies of an in particular multilayer circuit board, wherein it is proposed in this respect that additional layers or plies of a multilayer circuit board are arranged on the circuit board areas disposed on the substrate material and, in particular, having identical heights, as in correspondence with a further preferred embodiment of the method according to the invention.

Particularly during the manufacture of rigid-flexible circuit boards, the relative positioning of the individual circuit board areas and their contacting are of essential importance such that, considering the enhanced registration or positioning accuracy to be achieved by the invention, it is proposed according to a further preferred embodiment that the first circuit board area is comprised of a flexible circuit board area, and that the at least one further circuit board area is comprised of a substantially rigid circuit board area.

Particularly during the manufacture of a rigid-flexible circuit board as indicated above, the mounting of further layers or plies is usually avoided, at least in the region of the flexible circuit board area, in order to provide the desired flexibility of the circuit board area such that it is proposed according to a further preferred embodiment of the present invention that, after having connected the conducting patterns of the individual circuit board areas, the substrate material is at least partially removed in the region of the first circuit board area. Thus, an appropriately rigid and resistant substrate material can, for instance, be employed even in the manufacture of rigid-flexible circuit boards for mounting and/or connecting the individual circuit hoard areas, whereupon the substrate material is subsequently at least partially removed in the region of the first flexible circuit board area in order to, in particular, provide the flexible subarea.

To solve the initially identified objects, a circuit board of the above-defined kind, moreover, substantially additionally comprises:
at least one additional circuit board area substantially adjoining or at least partially overlapping the first circuit board area and oriented relative to the registration mark, and
a plurality of connections of the conducting or conductive patterns of the first circuit hoard area to the conducting or conductive patterns of the at least one additional circuit board area.

As already pointed out above, an enhanced mutual orientation or positioning accuracy of the individual or all circuit board areas has thus become possible by the at least one registration mark provided according to the invention in the substrate material such that, in particular, processing or treatment steps to be performed subsequently will likewise be feasible with elevated accuracy and, for instance, while forming further circuit hoard elements having reduced dimensions.

In order to achieve a proper and safe fixation of at least the first circuit board area, it is proposed according to a preferred embodiment that at least the first circuit board area is fixable to the substrate material via an interposed adhesive. By using an adhesive for arranging and/or fixing the first circuit board area, it will, furthermore, be possible to do with low-cost materials, in particular for the base materials of the further, adjoining circuit board areas, or circuit board areas at least partially overlapping or encroaching the first circuit board area.

Taking into account the elevated positioning or registration accuracy to be achieved by the at least one registration mark for at least the first circuit board area and the adjoining or contiguous circuit board areas, it is proposed, in particular in connection with the further production or arrangement of elements on the circuit board according to the invention, that at least one in particular electronic component is additionally arrangeable on the substrate material, and/or embedded in the at last one further circuit board area, and contactable with at least one conducting or conductive pattern, said component being orientable relative to the at least one registration mark, as in correspondence with a further preferred embodiment of the circuit board according to the invention. This will even enable electronic components usually comprising a plurality of connection or contact sites having comparatively small dimensions to be positioned and arranged, and subsequently contacted, in an appropriately precise manner without providing additional registration marks.

In order to simplify the contacting or connection of the conducting or conductive patterns of the individual circuit hoard areas, it is proposed according to a further preferred embodiment that the substrate material is formed by a conducting film.

In order to produce a multilayer circuit board after the arrangement or positioning of the individual circuit board areas, which are separated from each other as indicated above, it is proposed according to a further preferred embodiment that additional layers or plies of a multilayer circuit board are arranged or arrangeable on the circuit board areas disposed on the substrate material and, in particular, having substantially identical heights.

For the simple production of connections or contacts of the individual circuit board areas, it is, moreover, proposed that the connections between the conducting or conductive patterns of the individual circuit board areas are formed by passage openings filled with conductive material, i.e. vias, as in correspondence with a further preferred embodiment of the circuit board according to the invention.

According to a further preferred embodiment, it is, moreover, proposed that the first circuit hoard area is comprised of a flexible circuit board area and the at least one further circuit board area is comprised of a substantially rigid circuit board area.

SHORT DESCRIPTION OF THE DRAWINGS

In the following, the invention will be explained in more detail by way of exemplary embodiments schematically illustrated in the accompanying drawing. Therein:

FIG. 1 depicts a partial section through a first embodiment of a circuit board according to the invention, which was produced by the method according to the invention;

FIG. 2, in an illustration similar to that of FIG. 1, depicts a partial section through a modified embodiment of a circuit board according to the invention; and FIG. 3, again in a partially sectioned illustration, depicts a further modified embodiment of a circuit board according to the invention, which was produced by the method according to the invention.

DETAILED DESCRIPTION OF PREFERRED EMBODIMENTS

In FIG. 1, a substrate material provided with a plurality of registration marks 2 is denoted by 1.

On said substrate material 1, a first circuit board area 4 is arranged or fixed via interposed adhesive pads denoted by 3, the position or registration of the first circuit board area 4 relative to the registration mark 2 shown on the right-hand edge of the illustration according to FIG. 1 being denoted by a distance $l_1$. The distance $l_1$ in this context refers to the central position of both the registration mark 2 and the circuit board area 4.

The illustration in FIG. 1 is not to scale, since the relative dimensions of the registration marks 2 are, of course, smaller by magnitudes than the dimensions of the circuit board area 4. It is, moreover, to be anticipated that the relative dimensions of the individual circuit board areas, in particular the thickness to width or length ratios, are not to scale, either.

After the arrangement or fixation of the circuit board area 4 on the substrate material 1, the arrangement of further circuit board areas 5 and 6 is performed contiguously or consecutively to the circuit board area 4, wherein a distance between the circuit board areas 5 and 6 to the circuit board area 4, which is centrally arranged in FIG. 1, is illustrated on an enlarged scale for reasons of clarity.

While the circuit board area 4 may, for instance, be comprised of a flexible circuit board material, the circuit board areas 5 and 6 are, for instance, comprised of rigid circuit board areas, the latter being, for instance, formed by appropriately precut prepregs.

With regard to the mounting of further layers or plies of the circuit board, which in its entirety is denoted by 14, the provision of further circuit board areas 7 and also a circuit board area 8, which is arranged above the flexible area 4 and, in particular, removable later on, is subsequently performed.

In the illustration according to FIG. 1, the substrate material 1 is, for instance, formed by a film of a conducting or conductive material, in particular copper, wherein the partial region of the circuit board 14 illustrated in FIG. 1 is subsequently completed by providing a cover layer 9, which may again, for instance, be formed by a conducting or conductive material.

During the subsequent compression of the individual layers or plies of the embodiment according to FIG. 1, the arrangement of adhesive pads 3 for positioning or fixing the first circuit board area 4 will prevent the flowing of the adjacently located circuit board areas 5 and 6, or the base material of the same, in particular at an elevated pressure and/or temperature, thus enabling the circuit board areas to be connected to each other to be maintained or arranged in a dimensionally stable manner.

Furthermore, a connection or coupling of the conducting or conductive patterns of the individual circuit board areas 4 and 5, 6 and 7, respectively, to each other is effected, as is clearly apparent, in particular, of FIG. 3, such conducting or conductive patterns provided on or in the individual circuit board areas being known per se and, therefore, not illustrated in detail in the drawing.

Such a connection can also be made by appropriately patterning the substrate material 1, which in the present case is comprised of a conducting or conductive film, and/or by appropriately patterning the cover layer 9.

By providing at least one registration mark 2 in the substrate material 1, and positioning the first circuit board area 4 as well as the adjacent or consecutive circuit board areas 5, 6 relative to the registration mark 2, an increased orientation or positioning accuracy of the individual circuit board areas 4, 5, 6 and 7 relative to one another will be achieved such that it will, in particular, be possible to produce the necessary connections to be subsequently established with correspondingly small dimensions, and hence contribute to the miniaturization of the overall structure of the circuit board 14.

When forming the first circuit board area 4 as a flexible circuit board area for the production of a rigid-flexible circuit board 14, the removal of the removable subarea 8 and the at least partial removal of the substrate material as well as the cover layer 9 in the region of the flexible circuit board area 4 will be effected after completion of the sandwich structure comprised of several layers or plies of the circuit board 14, thus exposing the flexible circuit board area 4 in an appropriate manner.

In the embodiment illustrated in FIG. 2, the same reference numerals have been retained for identical or similar elements of FIG. 1.

Thus, a substrate material 1 formed with a plurality of registration marks 2 is also provided in the embodiment according to FIG. 2. Similarly as in the embodiment according to FIG. 1, a first subarea 4 of the circuit board is fixed via adhesive pads 3, wherein circuit board areas 5, 6 and 7 are again consecutively provided on the right-hand side of the illustration according to FIG. 2 similarly as in the embodiment according to FIG. 1.

In the embodiment according to FIG. 2, it is, moreover, provided that an in particular electronic component 10 is additionally arranged on the substrate material 1, or integrated in the circuit board 14, the fixation of the component 10 being again effected via an adhesive pad schematically indicated by 11. Contacting of the component 10 with at least one conducting or conductive pattern is effected by methods known per se, e.g. by soldering, via microvias, etc.

Between the flexible subarea 4 and the component 10 are provided circuit board areas 12 and 13 correspondingly matching in terms of dimensions.

Similarly as in the embodiment according to FIG. 1, the positioning of the circuit board area 4 relative to a registration mark 2 is again performed in accordance with the distance of the respectively central positions, which is again denoted by $l_1$.

Moreover, also the component 10 is arranged relative to the registration mark 2, with a distance $l_2$ being indicated.

It is immediately apparent that, by providing the registration mark 2 in the substrate material 1, it will thus be possible to achieve not only a correspondingly elevated orientation and positioning accuracy of the first circuit board area 4 and the adjoining circuit board areas 5, 6, 7 as well as 12 and 13, but also a correspondingly elevated relative positioning precision, in particular for contacting between the circuit board areas 4, 5, 6 and the component 10, which is not illustrated in detail.

Similarly as in the embodiment according to FIG. 1, a connection or coupling of the conducting or conductive patterns of the individual circuit board areas, which are again not illustrated, and the component 10 is effected, for instance, after the compression of individual layers or plies, which are illustrated separately in FIGS. 1 and 2. Also in this case, the substrate material 1, and optionally also the cover material 9, can be formed by a conducting or conductive material film.

If the circuit board area 4 is again configured as a flexible circuit board area, the area 8 may, for instance, again provide the desired flexibility of the altogether rigid-flexible circuit board 14 after compression and an at least partial removal of the cover layer 9, and optionally also the substrate material 1.

Instead of using a conducting or conductive material, it is also possible to form, in particular, the substrate material 1 of a rigid and solid base material, which can or will be removed at least in the region of the flexible subarea 4 after completion of the circuit board 14.

FIG. 3 depicts a further modified embodiment, wherein a first circuit board area 4 can be fixed to a substrate material again denoted by 1 and comprising a registration mark 2, via interposed adhesive pads 3.

Similarly as in the preceding embodiments, the orientation and/or positioning of the central or mid-position of the first circuit board area 4 relative to the registration mark 2 is again performed according to a selected distance $l_1$.

While in the embodiments according to FIGS. 1 and 2 circuit board areas 5, 6 disposed consecutive or contiguous to the circuit board area 4 are spatially adjacent, it is apparent from the embodiment illustrated in FIG. 3 that circuit board areas 15 are partially encompassing or overlapping the circuit board area 4. After having arranged or provided a cover layer again denoted by 9 for coupling or connecting the conducting or conductive patterns of the individual circuit board areas 4 and 15, respectively, passage openings, e.g. lasers, microvias 16, are produced, which will enable the coupling of conducting partial zones of the circuit board areas 4 and 15 by being filled with conducting or conductive material. Such microvias or, in general, passage openings 16 for coupling individual circuit board layers are known per se.

In the embodiment illustrated in FIG. 3, all circuit board regions 4 and 15 are, for instance, each formed by rigid circuit board areas or elements, thus enabling the circuit board area 4 to be integrated to be again precisely positioned relative to the registration mark 2.

The further mounting of additional plies of the circuit board again denoted by 14 is indicated arrows 17.

Overall, a strongly increased precision or accuracy in the orientation or positioning of individual circuit board areas 4, 5, 6, 7 and 15, respectively, relative to each other will thus be achieved by simply providing at least one registration mark 2 in a substrate material 1 or a base.

In addition to enabling a rigid-flexible configuration of a circuit board as indicated in FIGS. 1 and 2, it is also possible to produce such circuit board areas 4, 5, 6, 7 and 15 separately, for instance because of the different patterning and, in particular, different integration of additional elements, and subsequently assemble the same to form a complete circuit board structure 14 by coupling individual, separately produced circuit board areas.

Also in the embodiment illustrated in FIG. 3, an increased accuracy of the relative positioning between such additional components 10 and circuit board areas 4 and 15 to be connected or coupled to each other will be achieved in a manner similar as in the embodiment represented in FIG. 2, by additionally orienting further electronic components 10 relative to the registration mark 2.

Besides the direct arrangement or fixation of such an electronic component 10 directly on the substrate layer or substrate material 1 as illustrated in FIG. 2, the arrangement or integration of such an electronic component 10 can, for instance, also be performed in a circuit board area 5 or 6 or 15 adjoining to, or bordering on, the central circuit board area 4.

The invention claimed is:

1. A circuit board consisting of a plurality of circuit board areas, wherein the individual circuit board areas comprise at least one layer made of an insulating base material and a conducting or conductive pattern located on or in the base material, comprising:
   a substrate material,
   at least one registration mark formed within and through the substrate material,
   a first circuit board area arranged on the substrate material, said first circuit board area being oriented relative to the registration mark, and
   a plurality of connections of the conducting or conductive patterns of the first circuit board area to the conducting or conductive patterns of at least one additional circuit board area,
wherein the circuit board additionally comprises:
   the at least one additional circuit board area being arranged on the same or common surface of the substrate material as the first circuit board area, being adjoining or at least partially overlapping the first circuit board area, and being oriented relative to the registration mark; and
   wherein further layers of a multilayer circuit board are arranged on the circuit board areas disposed on the substrate material and the further layers have substantially identical heights;
   wherein at least one electronic component is additionally arranged on the substrate material, and embedded in the at least one additional circuit board area, and contactable with at least one conducting or conductive pattern, said component being orientable relative to the at least one registration mark.

2. The circuit board according to claim 1, wherein at least the first circuit board area is fixed to the substrate material via an interposed adhesive.

3. The circuit board according to claim 1, wherein the substrate material is formed by a conducting film.

4. The circuit board according to claim 1, wherein the connections between the conducting or conductive patterns of the individual circuit board areas are formed by passage openings filled with conductive material.

5. The circuit board according to claim 1, wherein the first circuit board area is comprised of a flexible circuit board area and the at least one additional circuit board area is comprised of a rigid circuit board area.

\* \* \* \* \*